United States Statutory Invention Registration [19]

[11] Reg. Number: H843

Kim et al. [43] Published: Nov. 6, 1990

[54] HIGH POWER RF GENERATION WITH OPTICALLY ACTIVATED BULK GAAS DEVICES

[75] Inventors: Anderson H. Kim, Eatontown; Maurice Weiner, Ocean; Lawrence J. Bovino, Eatontown; Robert J. Youmans, Point Pleasant, all of N.J.

[73] Assignee: The United States of America as represented by the Secretary of the Army, Washington, D.C.

[21] Appl. No.: 374,105

[22] Filed: May 26, 1989

[51] Int. Cl.[5] ..... H02M 7/46

[52] U.S. Cl. ..... 363/117

*Primary Examiner*—Thomas H. Tarcza
*Assistant Examiner*—Linda J. Wallace
*Attorney, Agent, or Firm*—Michael J. Zelenka; Ann M. Knab

[57] ABSTRACT

Utilizing sections of charged transmission line cables and optically-activated semiconductor switches, the direct generation of high power RF is demonstrated.

1 Claim, 3 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

HIGH POWER RF GENERATION WITH OPTICALLY ACTIVATED BULK GAAS DEVICES

The invention described herein may be manufactured, used and licensed by or for the Government without payment to us of royalty thereon.

TECHNICAL FIELD

This invention relates generally to radio frequency (RF) pulse power generation and more particularly to apparatus for generating RF pulse power from direct current (DC) by means of GaAs direct Switches.

BACKGROUND OF THE INVENTION

The conversion of DC energy directly to RF pulses with efficiency has many potential applications. Among such uses are: high-power electrical pulses for pulsed power devices and plasma-physic experiments; high resolution radar and time domain metrology; and the generation of megawatt level microwave and millimeter-wave pulses. These applications require the development of an appropriate switch or an array of switches which can switch high power with extremely fast rise time and zero jitter. A frozen wave generator has been developed, consisting of many segments of transmission line charged alternately with positive and negative voltage. Two adjacent segments are joined by a silicon switch which can be closed with a laser pulse. This concept is described by Chang, et al., in "Direct DC to RF Conversion By Picosecond Optoelectronic Switching," IEEE MTT-S International Microwave Symposium Digest, May 1984 which is herein incorporated by reference. A great deal of effort has been devoted to the investigation of photo-conductive semiconductor devices. Bulky microwave tubes and slow reset times have been associated with conventional RF generators. The present invention addresses these problems and more.

SUMMARY OF THE INVENTION

It is an object of the invention to produce an optically-activated RF generator with increased power output.

It is a further object of the invention to provide a RF generator having compact design which is capable of a fast rise time.

It is still a further object of the invention to produce a very cost effective RF generator.

The above and other objects are achieved in accordance with the invention wherein a transmission line is comprised of an output end, an open-terminated input end and a series of transmission line sections being serially disposed between the input end and the output end. Each transmission line section has a signal transmitting conductor which is electrically isolated from the signal transmitting conductors of the adjoining transmission line sections in the series of sections and a signal return conductor which is electrically interconnected with the signal return conductors of the adjoining transmission line sections in the series of sections. A DC power supply means is coupled to the signal transmitting conductors of the series of transmission line sections for charging each of the signal transmitting conductors with DC voltage potential standing waves having a magnitude commensurate with the magnitude of the RF pulse energy to be produced and polarities which are opposite to the polarities of the DC voltage potential standing waves to which the adjoining signal transmitting conductors in the series of transmission line sections are charged. A plurality of optically-activated GaAs normally-open switches which each have a block of GaAs and a pair of switch electrodes mounted on opposite faces of the block are coupled in series with a load. At least one of pair of switch electrodes has a plurality of light-transmitting apertures formed therein which permit light striking the electrode to reach the face of the block beneath the electrode. A circuit means is coupled to the switch electrodes of the plurality of GaAs switches for coupling one of the switches in series circuit with a load across the output end of the transmission line and for coupling each of the remainder of switches in series circuit between the signal transmitting conductors of a different one of the pairs of adjoining transmission line sections in the transmission line. A fiber optic means is coupled between a laser means and the light apertured electrodes of all of the plurality of GaAs switches. The laser means emits pulses of light at a predetermined repetition rate, the light pulses being at a wavelength which will cause the blocks of GaAs in each of the plurality of switches to close and to thereby connect the signal transmitting conductor of the transmission line in series circuit with the load, whereby a RF pulse transmission of the DC voltage potential standing waves is transmitted to the load.

DETAILED DESCRIPTION OF THE DRAWINGS

Figure 1:
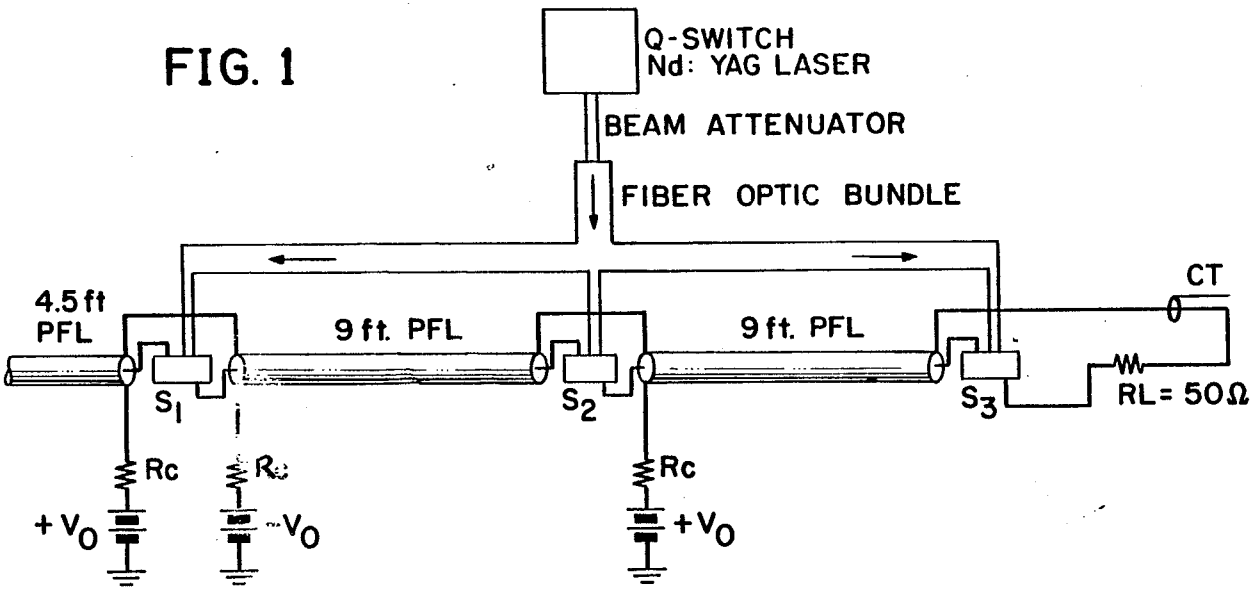
FIG. 1 is a schematic diagram of a three-switch RF generator.
Figure 2:
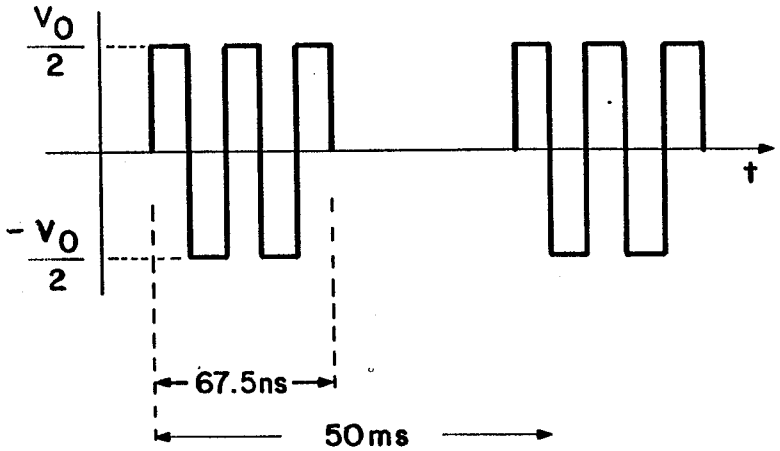
FIG. 2 displays a waveform from the RF generator.

The RF generator consists of charged coaxial transmission lines (PFL) and gridded GaAs OAS devices. As shown in FIG. 1, the circuit has three segments of PFL's charged by positive and negative voltage Vo. Adjacent PFL's are connected with a bulk GaAs OAS. Since semi-insulating GaAs has a high resistivity ($>10^7$ ohm-cm), the leakage current is negligible. When all switches are fired simultaneously, the standing waves, which have amplitude Vo/2, start to move in the forward and backward directions. The forward wave travels toward the output load and appears on the load resistor. The backward wave moves toward the open termination end, is totally reflected from the open termination end, and then moves back toward the output load. The half period of the RF generated is the transit time for the standing wave to travel across the PFL of length L. The repetition frequency of the burst of RF is determined by the repetition rate of laser system. The predicted generation of the RF burst is given in FIG. 2.

Figure 3:
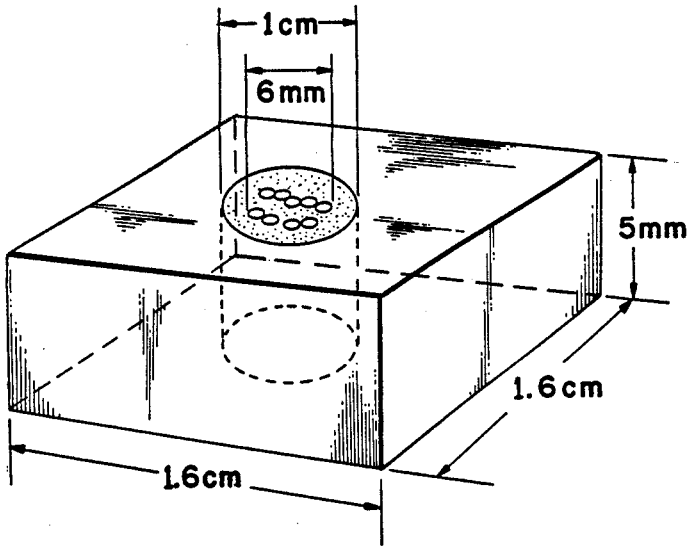
FIG. 3 illustrates a gridded optically activated switch (OAS) device.
Figure 4:
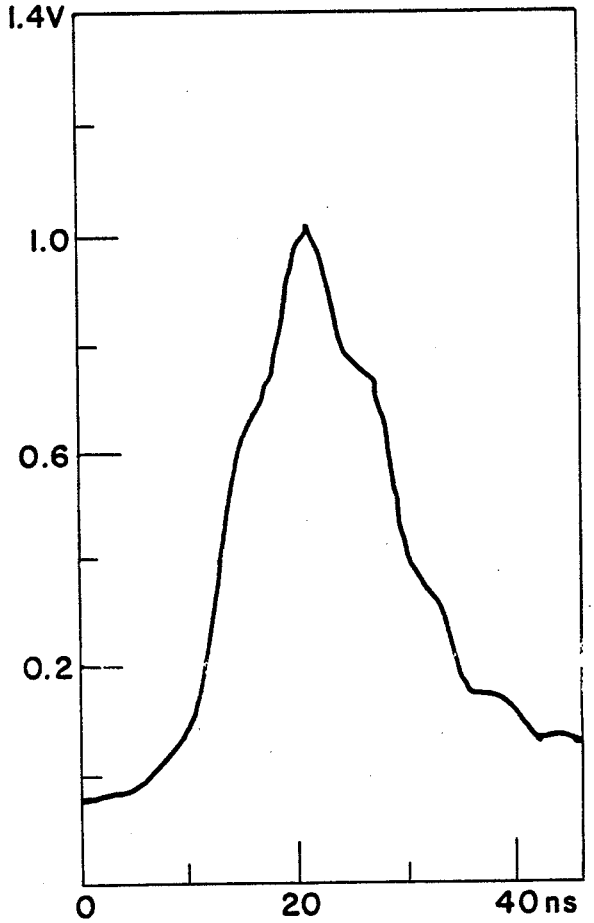
FIG. 4 is the graphic response of a laser light pulse leaving the fiber optic bundle.
Figure 5:
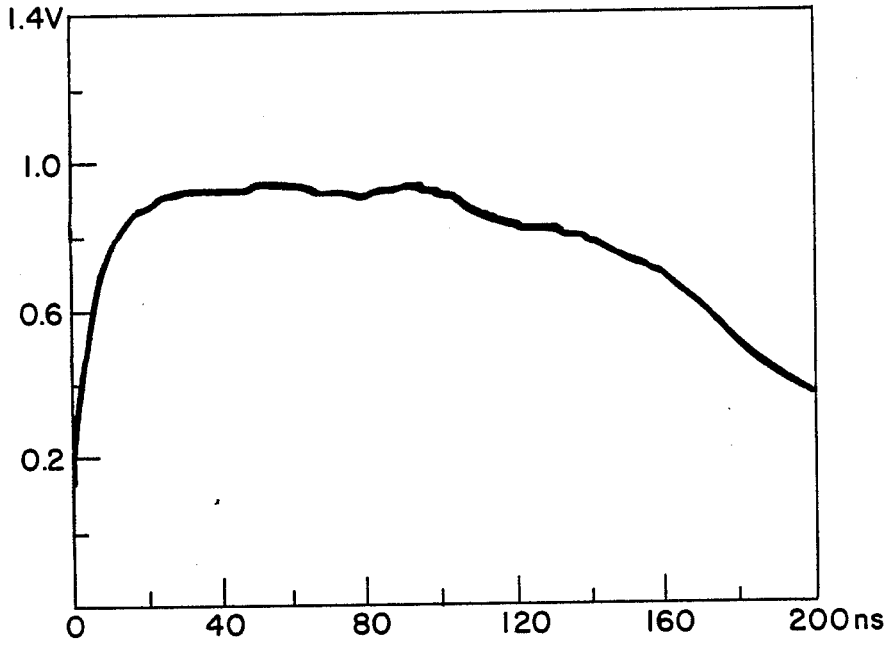
FIG. 5 displays a switch current waveform.

In most high power bulk OAS devices the light is introduced perpendicular to the applied field direction. Although these devices showed very high power capability, multiple OAS operation required highly efficient devices as well. Recently, optically activated gridded silicon PIN diodes demonstrated high efficiency. Utilizing this concept, optically activated gridded bulk GaAs devices were designed and fabricated at ETDL. The typical bulk GaAs OAS is shown in FIG. 3. In these switches the light is introduced parallel to the applied field direction. The test results of these devices shows significant improvement of efficiency. With light from a 20 ns Q-switched Nd:YAG laser, emanating a fiber optic bundle, the switch turn-on was sustained for 150 ns without distortion. The FIG. 4 shows the laser light pulse waveform leaving the fiber optic bundle. FIG. 5 shows the resulting switch current waveform with a 200 ns PFL, biased at 2 KV. The OAS was turned on with laser energy as small as 0.8 mJ. The current latch-on and low threshold laser energy is assumed due to field-introduced avalanche effect. On-state voltage was very small. The parametric relationship of applied voltage, optical energy, and output pulse width will be discussed elsewhere.

It is necessary to supply each of the switches with sufficient laser energy. This was implemented with fiber optic bundles. The advantage of this technique is that each bundle may contain varying fiber lengths, thus effectively increasing the width of the light pulse and insuring the switch stays on, until all forward and backward waves pass through.

This is particularly critical for switch number 3, which must stay on the longest time In this experiment, however, it was unnecessary to use varying fiber lengths, since the OAS gridded device stayed on fairly long, up to 150 ns. In order to achieve wider burst pulse widths, however, the use of incremental fiber lengths may be expected to play a role.

Figure 6:
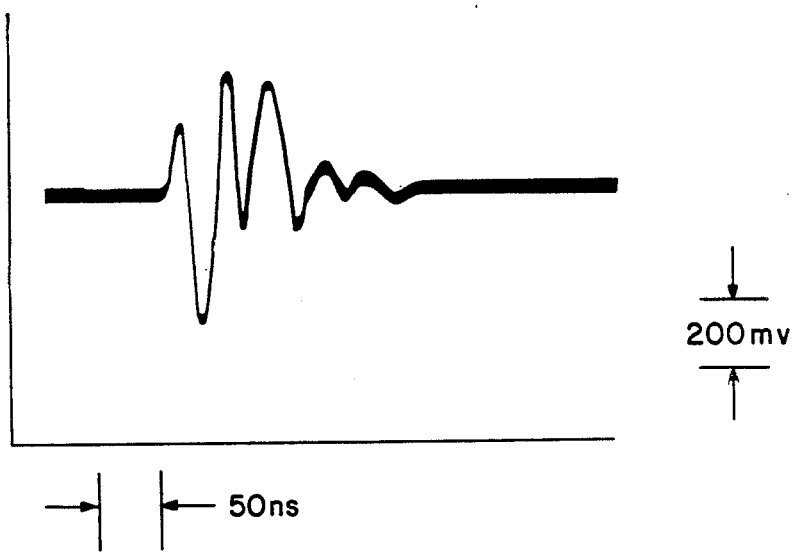
FIG. 6 illustrates a RF waveform obtained by a current transformer.

Each switch was tested individually at 2 KV DC bias with 0.8 mJ light energy from a Q-switched Nd:YAG laser (20 ns pulse width). The coaxial cable lengths of the 3-stage generator were 9 feet, 9 feet, and 4.5 feet respectively, with an anticipated total pulsewidth of 67.5 ns. Since this width is less than the recovery time (150 ns) of the OAS, simultaneous triggering of the switches was employed, and thus equal lengths of fibers were used to convey the light to the switches. A typical waveform, is shown in FIG. 6, obtained by a current transformer, the Tektronix CT-1.

The maximum current achieved was approximately 12 amps, with a pulsewidth of about 100 ns, instead of the anticipated values of 20 amps and 67.5 ns. The longer pulsewidth, as well as the lower current amplitude, are caused primarily by inductance in the connections between OAS devices. This inductance will be eliminated by incorporating the switch into the transmission line. Narrower light pulses also will be used to minimize the effect of the risetime of the light signal. Unequal distribution of the light among the various switches must also be addressed.

What is claimed is:

1. An optically-activated RF generator for producing high power RF pulse energy from applied DC energy comprising:

a transmission line having an output end, an open-terminated input end and a series of transmission line sections serially disposed between said input end and said output end, each of said transmission line sections having a signal transmitting conductor which is electrically isolated from the signal transmitting conductors of the adjoining transmission line sections in said series of sections and a signal return conductor which is electrically interconnected with the signal return conductors of the adjoining transmission lines sections in said series of sections;

a DC power supply means coupled to the signal transmitting conductors of said series of transmission line sections for charging each of said signal transmitting conductors with DC voltage potential standing waves having a magnitude commensurate with the magnitude of the RF pulse energy to be produced and polarities which are opposite to the polarities of the DC voltage potential standing waves to which the adjoining signal transmitting conductors in said series of transmission line sections are charged;

a load;

a plurality of optically-activated GaAs normally-open switches, each of said switches having a block of GaAs and a pair of switch electrodes mounted on opposite faces of said block, at least one of said pair of switch electrodes having a plurality of light-transmitting apertures formed therein which permit light striking the electrode to reach the face of the block beneath the electrode;

a circuit means coupled to the switch electrodes of said plurality of GaAs switches for coupling one of said switches in series circuit with said load across the output end of said transmission line and for coupling each of the remainder of said switches in series circuit between the signal transmitting conductors of a different one of the pairs of adjoining transmission line sections in said transmission line;

a laser means for emitting pulses of light at a predetermined repetition rate, said light pulses being at a wavelength which will cause the blocks of GaAs in each of said plurality of switches to become electrically conductive; and a fiber optic means coupled between said laser means and the light apertured electrodes of all of said plurality of GaAs switches for causing all of said switches to close and to thereby connect the signal transmitting conductor of said transmission line in series circuit with said load, whereby a RF pulse transmission of said DC voltage potential standing waves is transmitted to said load.

* * * * *